United States Patent
Chiang et al.

(10) Patent No.: US 12,424,819 B2
(45) Date of Patent: Sep. 23, 2025

(54) EDGE-EMITTING SEMICONDUCTOR LASER WITH HIGH THERMAL CONDUCTIVITY AND LOW REFLECTION FRONT MIRROR SURFACE

(71) Applicant: ARIMA LASERS CORP., Taoyuan (TW)

(72) Inventors: Chen Yu Chiang, Taoyuan (TW); Jung Min Hwang, Taoyuan (TW)

(73) Assignee: ARIMA LASERS CORP., Taoyuan (TW)

( * ) Notice: Subject to any disclaimer, the term of this patent is extended or adjusted under 35 U.S.C. 154(b) by 701 days.

(21) Appl. No.: 17/804,250

(22) Filed: May 26, 2022

(65) Prior Publication Data

US 2023/0387656 A1    Nov. 30, 2023

(51) Int. Cl.
*H01S 5/028*     (2006.01)
*H01S 5/024*     (2006.01)

(52) U.S. Cl.
CPC ........ *H01S 5/0282* (2013.01); *H01S 5/02469* (2013.01)

(58) Field of Classification Search
CPC ............... H01S 5/0282; H01S 5/02469; H01S 5/02461; H01S 5/0287; H01S 5/028; H01S 5/0284; H01S 5/0285; H01S 5/024; H01S 5/4031

See application file for complete search history.

(56) References Cited

U.S. PATENT DOCUMENTS

| | | | | |
|---|---|---|---|---|
| 6,396,864 | B1* | 5/2002 | O'Brien | H10K 50/87 |
| | | | | 372/49.01 |
| 7,106,775 | B2* | 9/2006 | Matsuoka | H01S 5/028 |
| | | | | 372/49.01 |
| 2003/0123506 | A1* | 7/2003 | Yamanaka | H01S 5/028 |
| | | | | 372/49.01 |
| 2020/0203921 | A1* | 6/2020 | Fuchs | H01S 5/4031 |

FOREIGN PATENT DOCUMENTS

KR         20140127034         * 11/2014         ........... H01S 5/0285

* cited by examiner

*Primary Examiner* — Xinning(Tom) Niu
*Assistant Examiner* — Delma R Forde
(74) *Attorney, Agent, or Firm* — Birch, Stewart, Kolasch & Birch, LLP

(57) ABSTRACT

An edge-emitting semiconductor laser with high thermal conductivity and low reflection front mirror surface, comprising: an edge-emitting semiconductor laser die having a rear mirror surface and a front mirror surface on the lateral side, and the electromagnetic radiation generated by the edge-emitting semiconductor laser die is in the wavelength range of 635 nm to 1550 nm; a rear mirror surface coating; and a front mirror surface e, and a passivation layer, an affinity layer, a high thermal conductivity layer and a protective layer. Whereby, providing an edge-emitting semiconductor laser with high thermal conductivity and low reflection front mirror surface, and the front mirror surface coating is made of high thermal conductivity insulating materials to form a multi-layer coating structure, so that the (Continued)

front mirror surface coating has the effect of high thermal conductivity and low reflection.

4 Claims, 1 Drawing Sheet

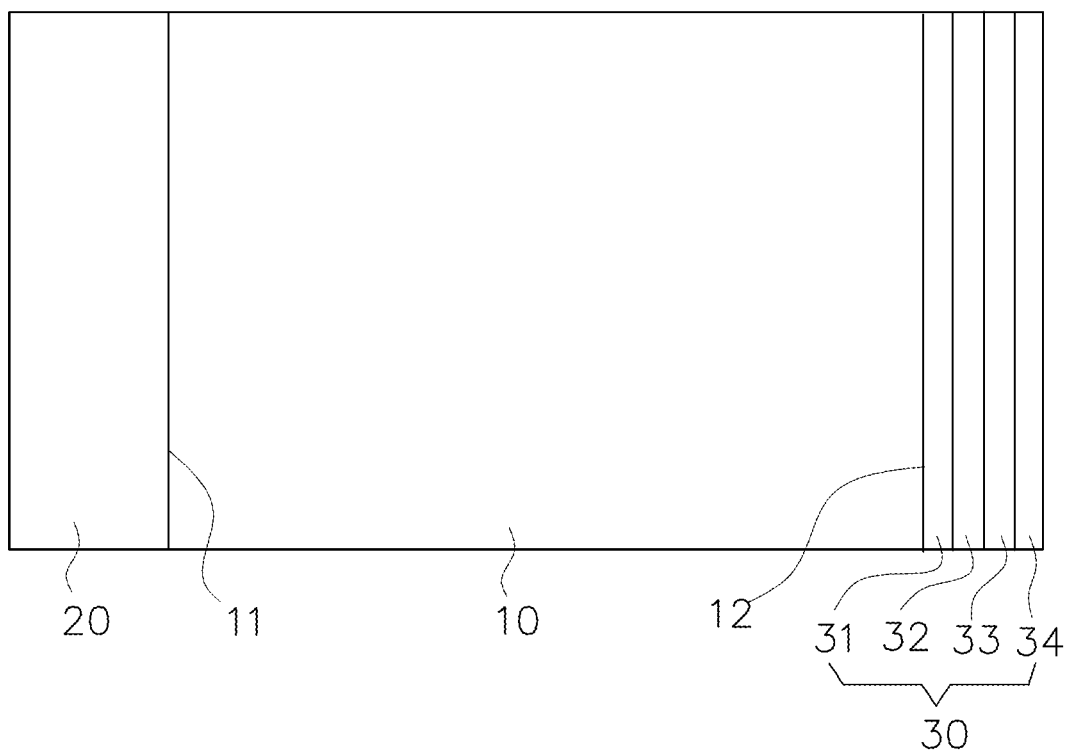

EDGE-EMITTING SEMICONDUCTOR LASER WITH HIGH THERMAL CONDUCTIVITY AND LOW REFLECTION FRONT MIRROR SURFACE

BACKGROUND OF THE INVENTION

1. Field of the Invention

The invention relates to an edge-emitting semiconductor laser with high thermal conductivity and low reflection front mirror surface, especially to one that makes the front mirror surface coating use high thermal conductivity insulating materials to form a multi-layer coating structure, so that the front mirror surface coating has high thermal conductivity and low reflection.

2. Description of the Related Art

When the irreversible death phenomenon occurs in the operation of the semiconductor laser element, also known as Catastrophic optical damage. Usually, the cause of death of the semiconductor laser element is because the defect extends into the light-emitting layer, so that the photon cannot do effective resonance in the resonant cavity. The source of the defect can be classified into two types, one is the defect in the epitaxial process, which will eventually form Catastrophic optical bulk damage (COBD), and the other is that the source of the defect exists on the mirror surface, and finally forms Catastrophic optical mirror damage (COMD); Wherein, edge-emitting semiconductor lasers use the mirror coating technology to avoid damage to optical mirrors. It can be independent from the entire die production process, and can choose whether to execute it without changing the process.

Edge-emitting semiconductor lasers usually coat the front mirror surface with a low-reflectivity film, and the rear mirror with a high-reflectivity film, so that most of the laser light is emitted from the front mirror surface to facilitate back-end applications. Furthermore, if extremely low reflectivity is required in order to increase the light emitting efficiency of the front mirror surface, the effect of the single-layer front mirror reflective film is limited, and the target of extremely low reflectivity can be achieved through the multi-layer front mirror reflective film; The increase in efficiency also means that the output end will be very hot, usually generating more than 40% waste heat. The waste heat will increase the temperature of the laser element, reduce the wall-plug efficiency, and also cause the wavelength to drift, affecting the performance of the laser element; for the hottest area of the light-emitting surface, the maximum temperature can reach 120~150 Celsius degrees. If the heat source cannot be removed effectively, it will affect the characteristics and life of the laser element, and the worst will cause the entire coating structure collapsed.

In the mirror coating technology of edge-emitting semiconductor lasers, $Al_2O_3$ is the most commonly used material for mirror coating. The reason is that it has a high affinity with GaAs substrates and has strong heat resistance, which is very suitable as a laser mirror emit surface. However, in the process of coating, the dissociated oxygen element is easily adsorbed on the mirror surface that has just been split (there are many dangling bonds), and the adsorption of oxygen element will form defects, resulting in higher thermal resistance; When the laser element is operated for a long time, the heat will continue to accumulate on these defects of the high thermal resistance, which will cause the temperature to rise; after the temperature rises, the defects will expand, and the temperature will rise again, and the repeated action will form a vicious cycle, and finally the mirror material is melted, resulting in COMD; therefore, the prior art U.S. Pat. No. 6,826,218 discloses that a high purity (>99%) silicon film is added on the emit surface, because the silicon film does not contain oxygen during the evaporation process, the floating bond on the split surface forms a bond with silicon. This silicon film is equivalent to a passivation layer. When $Al_2O_3$ is plated later, the oxygen element is blocked by the silicon film and cannot form defects, which can also prevent the mirror surface from Plasma bombardment that creates more defects, but the silicon film absorbs light below 800 nm wavelength.

SUMMARY OF THE INVENTION

It is a primary objective of the present invention to provide an edge-emitting semiconductor laser with high thermal conductivity and low reflection front mirror surface which make the front mirror surface coating is made of high thermal conductivity insulating materials combined to form a multi-layer coating structure, so that the front mirror surface coating has the effect of high thermal conductivity and low reflection.

It is another objective of the present invention to achieve having a production process with coating uses aluminum targets and can be continuously completed in the same cavity.

In order to achieve the above objectives, the present invention includes: an edge-emitting semiconductor laser die having a rear mirror surface and a front mirror surface on the lateral side, and the electromagnetic radiation generated by the edge-emitting semiconductor laser die is in the wavelength range of 635 nm to 1550 nm; a rear mirror surface coating is formed on the rear mirror surface; and a front mirror surface coating is formed on the front mirror surface, and a passivation layer, an affinity layer, a high thermal conductivity layer and a protective layer are sequentially formed from the inside to the outside.

Also, the material selected for the passivation layer is aluminum (Al), the material selected for the affinity layer is aluminum oxide ($Al_2O_3$), the material selected for the high thermal conductivity layer is aluminum nitride (AlN), and the material selected for the protective layer is aluminum oxide ($Al_2O_3$).

Also, the reflectivity of the high thermal conductivity multilayer film formed by combining the affinity layer, the high thermal conductivity layer and the protective layer is less than 0.5%.

Also, the material thickness range of the passivation layer is 1.5~4 nm, the material thickness range of the affinity layer is 26~72 nm, the material thickness range of the high thermal conductivity layer is 28~78 nm, the material thickness range of this protective layer is 26~72 nm, wherein the preferred material thickness of the passivation layer is 3 nm, the preferred material thickness of the affinity layer is 44 nm, the preferred material thickness of the high thermal conductivity layer is 47.6 nm, and the preferred material thickness of the protective layer is 44 nm.

Also, the front mirror surface coating is fabricated using an electron cyclotron resonance-chemical vapor deposition (ECR-CVD) machine.

BRIEF DESCRIPTION OF THE DRAWINGS

The FIGURE is a schematic diagram showing the structure of the present invention.

DETAILED DESCRIPTION OF THE PREFERRED EMBODIMENT

Referring to the FIGURE, the present invention, comprising: an edge-emitting semiconductor laser die 10 having a rear mirror surface 11 and a front mirror surface 12 on the lateral side, and the electromagnetic radiation generated by the edge-emitting semiconductor laser die 10 is in the wavelength range of 635 nm to 1550 nm; a rear mirror surface coating 20 is formed on the rear mirror surface 11; and a front mirror surface coating 30 is formed on the front mirror surface 12, and a passivation layer 31, an affinity layer 32, a high thermal conductivity layer 33 and a protective layer 34 are sequentially formed from the inside to the outside; the material selected for the passivation layer 31 is aluminum (Al), the material selected for the affinity layer 32 is aluminum oxide ($Al_2O_3$), the material selected for the high thermal conductivity layer 33 is aluminum nitride (AlN), and the material selected for the protective layer 34 is aluminum oxide ($Al_2O_3$); and the reflectivity of the high thermal conductivity multilayer film formed by combining the affinity layer 32, the high thermal conductivity layer 33 and the protective layer 34 is less than 0.5%.

Moreover, the material thickness range of the passivation layer 31 is 1.5~4 nm (preferred 3 nm), the material thickness range of the affinity layer 32 is 26~72 nm (preferred 44 nm), the material thickness range of the high thermal conductivity layer 33 is 28~78 nm (preferred 47.6 nm), the material thickness range of this protective layer 34 is 26~72 nm (preferred 44 nm); wherein the relation between the thickness (d1) and the wavelength (λ) of the affinity layer 32 whose material is aluminum oxide and the protective layer 34 whose material is aluminum oxide is: $d1=(0.3\pm0.01)*\lambda/4/n1$, n1 is the refractive index of aluminum oxide; the relation between the thickness (d2) and the wavelength (λ) of the high thermal conductivity layer 33 whose material is aluminum nitride is: $d2=(0.4\pm0.01)*\lambda/4/n2$, n2 is the refractive index of aluminum nitride.

With the feature disclosed above, the mirror floating bond and high temperature heat dissipation is the main problem of the edge-emitting semiconductor laser during operation; therefore, the present invention provide a four-layer structure of the front mirror surface coating 30. The first layer is the passivation layer 31, and the material is aluminum. First, make the floating bonds on the split surface of the edge-emitting semiconductor laser die 10 bond with aluminum; the second layer is the affinity layer 32, and the material is $Al_2O_3$ has high affinity with GaAs substrate and has a similar expansion coefficient. The third layer is a high thermal conductivity layer 33, and the material is AlN. However, since AlN itself is deliquescent by water vapor, it will be equipped with a fourth layer of protective layer 34, which material is $Al_2O_3$; according to this design, the front mirror surface coating 30 selects high thermal conductivity insulating materials to form a multi-layer coating structure, so that the front mirror surface coating 30 has the effect of high thermal conductivity and low reflection; however, the front mirror surface coating 30 can be fabricated by using an electron cyclotron resonance-chemical vapor deposition (ECR-CVD) machine, because production process with coating uses aluminum targets, it can be continuously completed in the same cavity; in addition, the affinity layer 32, the high thermal conductivity layer 33 and the protective layer 34 can be adjusted according to different laser wavelength products to form a high thermal conductivity multilayer film.

What is claimed is:

1. An edge-emitting semiconductor laser with high thermal conductivity and low reflection front mirror surface, comprising:
   an edge-emitting semiconductor laser die 10 having a rear mirror surface 11 and a front mirror surface 12 on the lateral side, and the electromagnetic radiation generated by the edge-emitting semiconductor laser die 10 is in the wavelength range of 635 nm to 1550 nm;
   a rear mirror surface coating 20 is formed on the rear mirror surface 11; and
   a front mirror surface coating 30 is formed on the front mirror surface 12, and a passivation layer 31, an affinity layer 32, a high thermal conductivity layer 33 and a protective layer 34 are sequentially formed from the inside to the outside;
   wherein the material selected for the passivation layer 31 is aluminum (Al), the material selected for the affinity layer 32 is aluminum oxide (Al2O3), the material selected for the high thermal conductivity layer 33 is aluminum nitride (AlN), and the material selected for the protective layer 34 is aluminum oxide (Al2O3); and
   the reflectivity of the high thermal conductivity multilayer film formed by combining the affinity layer 32, the high thermal conductivity layer 33 and the protective layer 34 is less than 0.5%.

2. The edge-emitting semiconductor laser with high thermal conductivity and low reflection front mirror surface as claimed in claim 1, wherein the relation between the thickness (d1) and the wavelength (λ) of the affinity layer 32 whose material is aluminum oxide and the protective layer 34 whose material is aluminum oxide is: $d1=(0.3\pm0.01)*\lambda/4/n1$, n1 is the refractive index of aluminum oxide; the relation between the thickness (d2) and the wavelength (λ) of the high thermal conductivity layer 33 whose material is aluminum nitride is: $d2=(0.4\pm0.01)*\lambda/4/n2$, n2 is the refractive index of aluminum nitride; therefore, the material thickness range of the passivation layer 31 is 1.5~4 nm, the material thickness range of the affinity layer 32 is 26~72 nm, the material thickness range of the high thermal conductivity layer 33 is 28~78 nm, the material thickness range of this protective layer 34 is 26~72 nm.

3. The edge-emitting semiconductor laser with high thermal conductivity and low reflection front mirror surface as claimed in claim 2, wherein the preferred material thickness of the passivation layer 31 is 3 nm, the preferred material thickness of the affinity layer 32 is 44 nm, the preferred material thickness of the high thermal conductivity layer 33 is 47.6 nm, and the preferred material thickness of the protective layer 34 is 44 nm.

4. The edge-emitting semiconductor laser with high thermal conductivity and low reflection front mirror surface as claimed in claim 3, wherein the front mirror surface coating 30 is fabricated using an electron cyclotron resonance-chemical vapor deposition (ECR-CVD) machine.

* * * * *